(12) United States Patent
Nishikawa

(10) Patent No.: US 8,918,298 B2
(45) Date of Patent: Dec. 23, 2014

(54) SOLAR CELL EVALUATION DEVICE AND SOLAR CELL EVALUATION METHOD

(75) Inventor: Yoshihiro Nishikawa, Kobe (JP)

(73) Assignee: Konica Minolta Sensing, Inc., Osaka (JP)

( * ) Notice: Subject to any disclaimer, the term of this patent is extended or adjusted under 35 U.S.C. 154(b) by 232 days.

(21) Appl. No.: 13/129,770

(22) PCT Filed: Sep. 15, 2009

(86) PCT No.: PCT/JP2009/066105
§ 371 (c)(1),
(2), (4) Date: May 17, 2011

(87) PCT Pub. No.: WO2010/058649
PCT Pub. Date: May 27, 2010

(65) Prior Publication Data
US 2011/0231120 A1    Sep. 22, 2011

(30) Foreign Application Priority Data

Nov. 19, 2008   (JP) ................. 2008-295499

(51) Int. Cl.
*G01R 21/00* (2006.01)
*G01R 31/40* (2014.01)

(52) U.S. Cl.
CPC ................... *G01R 31/405* (2013.01)
USPC ................ 702/60; 702/58; 702/64

(58) Field of Classification Search
CPC .................................................. G01R 31/405
USPC ........... 702/60, 58, 64, 182, 138, 188, 72, 1, 702/65, 61, 189, 62
See application file for complete search history.

(56) References Cited

U.S. PATENT DOCUMENTS 6,876,187 B2 * 4/2005 Matsuyama .................. 324/96
6,946,858 B2   9/2005 Matsuyama
(Continued)

FOREIGN PATENT DOCUMENTS

EP   1 170 596 A2   1/2002
EP   1 179 857 A2   2/2002
(Continued)

OTHER PUBLICATIONS

International Search Report in International Application No. PCT/JP2009/066105, mailed Oct. 27, 3 pages.
(Continued)

*Primary Examiner* — John Breene
*Assistant Examiner* — Stephanie Bloss
(74) *Attorney, Agent, or Firm* — Brinks Gilson & Lione

(57) ABSTRACT

In a solar cell evaluation device 1, a spectral sensitivity $P(\lambda)$ of a solar cell 2, which is a measurement object, is measured in advance. When the solar cell 2 is evaluated, a spectral irradiance $L(\lambda)$ of illumination light is measured, generated power EL of the solar cell 2 that is generated with the illumination light is measured, and the measured generated power EL of the solar cell 2 is converted into generated power ES generated by the solar cell 2 in the case of illumination with illumination light with a spectral irradiance $S(\lambda)$ based on the reference solar light. Therefore, since the calibration in the solar cell evaluation device 1 is performed with software, the calibration can be performed in a simple manner and at a low cost even when the solar cell type is changed.

5 Claims, 5 Drawing Sheets

(56) References Cited

U.S. PATENT DOCUMENTS

| | | |
|---|---|---|
| 2002/0014886 A1 | 2/2002 | Matsuyama |
| 2002/0030153 A1 | 3/2002 | Matsuyama |
| 2004/0056648 A1 | 3/2004 | Matsuyama |
| 2006/0085167 A1* | 4/2006 | Warfield et al. ............... 702/188 |
| 2009/0115446 A1* | 5/2009 | Shimotomai ................. 324/767 |
| 2009/0179662 A1* | 7/2009 | Moulton et al. ............. 324/771 |
| 2009/0267632 A1* | 10/2009 | Rowe et al. .................. 324/765 |
| 2012/0303298 A1* | 11/2012 | Nakai et al. .................... 702/60 |

FOREIGN PATENT DOCUMENTS

| | | |
|---|---|---|
| EP | 1 170 596 A3 | 1/2006 |
| EP | 1 179 857 A3 | 3/2006 |
| JP | 2-244654 | 9/1990 |
| JP | 08-235903 | 9/1996 |
| JP | 2003-031825 | 1/2003 |
| JP | 2004-134748 | 4/2004 |
| JP | 2005-011958 | 1/2005 |
| JP | 2005 011958 A | 1/2005 |
| JP | 2005-197432 | 7/2005 |
| JP | 2006-229063 | 8/2006 |
| JP | 2006 229063 A | 8/2006 |

OTHER PUBLICATIONS

Field, H., et al., "An Uncertainty Analysis of the Spectral Correction Factor," IEEE, 1993, pp. 1180-1187.

Katz, E.A., et al., "Temperature Dependence for the Photovoltaic Device Parameters of Polymer-Fullerene Solar Cells under Operating Conditions," Journal of Applied Physics, vol. 90, No. 10, Nov. 15, 2001, pp. 5343-5350.

Roth, T., et al., "Improving the Accuracy of Suns-VOC Measurements Using Spectral Mismatch Correction," Presented at the 33rd IEEE Photovoltaic Specialists Conference, May 11-16, 2008 at San Diego, California, 5 pages.

European Search Opinion regarding corresponding European patent application EP 09 82 7430.

* cited by examiner

SOLAR CELL EVALUATION DEVICE AND SOLAR CELL EVALUATION METHOD

TECHNICAL FIELD

The present invention relates to a method and a device for evaluating a solar cell.

BACKGROUND ART

Solar cells have recently gained widespread popularity and the competition among manufactures and products has intensified. As for the composition of solar cells, a large number of types including amorphous silicon, thin-film silicon, and organic compounds have been developed in addition to the conventional single crystal silicon. Accordingly, in order to evaluate fairly the photoelectric conversion efficiency of solar cells, the evaluation methods therefor have been defined by IEC60794 and JIS standard (C8905-C8991). Summarizing the standard, the performance of a solar cell is evaluated by measuring the generated power of the solar cell by using an illumination device (referred to hereinbelow as "solar simulator") emitting light that simulates a spectrum and an irradiance identical to those of solar light of Air Mass 1.5 (referred to hereinbelow as "reference solar light"). FIG. 6 shows spectrum and irradiance (referred to hereinbelow as "spectral irradiance $S(\lambda)$") of the reference solar light.

As shown in FIG. 7, the solar light of Air Mass 1.5 is obtained when light (AM0) from the outer space falls on the ground surface at an angle of 42 degrees. The AM0 light undergoes scattering and absorption when passing through the air, and spectrum, wavelength distribution, and irradiance thereof change as shown in the below-described FIG. 4.

The generated power can be measured by measuring the values of current and voltage outputted in the DC mode and therefore a predetermined measurement accuracy can be obtained. However, the simulated solar light necessary for measuring the generated power is difficult to generate, and specifications required for the aforementioned solar simulator are defined in C8912 in the aforementioned JIS standard. The principal requirements are described below.

- Irradiance should have a predetermined value (1,000±50 W/m²).
- Illumination unevenness should be less than a predetermined value.
- Spectral irradiance should be less than a predetermined value.
- Fluctuations of irradiance with time should be less than a predetermined value.
- Illumination light should be parallel light.

Accordingly, Patent Document 1 suggests a solar simulator configured so that light beams from a plurality of light sources (a xenon light source and a halogen light source) generating light with mutually different wavelength ranges are selectively transmitted/reflected by a mirror having a wavelength dependence and the transmitted/reflected beams are synthesized, thereby generating light having a spectrum similar to that of solar light from UV to IR.

Further, in a product YSS-50A manufactured by Yamashita Denso Co., Ltd., a relative illumination sensor is incorporated in a solar simulator, and the generated power that depends on the fluctuations in the light source is calibrated on the basis of the sensor detection results.

Further, in the configuration described in Patent Document 2, in order to correct light quantity fluctuations of a solar simulator, the solar source irradiance is measured and the response characteristic of the illumination measuring sensor is matched with the response characteristic of the solar cell itself, thereby canceling the light quantity fluctuations of the solar simulator.

The related art suggested in the aforementioned Patent Document 1 and Patent Document 2 represents calibration methods performed with a single solar simulator. However, solar simulators differ among the manufacturers and the devices produced by the same manufacturer can differ from one another, and even if each device satisfies the above-described characteristics, the generated power will differ if the measurements are conducted with different solar simulators.

Accordingly, the measurer sends sample solar cells for measurements, for example, to the National Institute of Advanced Industrial Science and Technology (a national entity having reference solar light spectra that are internationally unified, or an agency corresponding thereto). The agency measures the generated power of the sample by using the proprietary solar simulator that is very close to the reference solar light, describes the measured value (=A) and sends it to the measurer. Upon receiving the measured value, the measurer thereafter uses the returned sample as a reference cell in its own company for calibrating the solar simulators. Thus, the measurer adjusts the light quantity of the solar simulator by using the reference cell so that the generated power becomes the aforementioned measured value A and then measures the generated power of the solar cell that is to be actually measured. With such a method, it is difficult to reproduce strictly the reference solar light spectrum, but this method serves to match solar simulators of each company therewith.

However, with the above-described method, it is necessary for the measurer to produce and send by mail a sample and for the public agency to measure and send back the sample before the calibration with the reference cell is completed. Therefore, the method is time consuming and costly. Moreover, it is not sufficient to perform the calibration once. Thus, the new reference cell should be produced and the calibration should be repeated each time the spectral sensitivity of the solar cell that is to be measured changes, and the aforementioned time and cost increase dramatically.

Patent Document 1: Japanese Patent Application Publication No. H8-235903.
Patent Document 2: Japanese Patent Application Publication No. 2004-134748.

SUMMARY OF THE INVENTION

The present invention has been created with the foregoing in view, and it is an object of the present invention to provide a solar cell evaluation device and method that can perform calibration in a simple manner and at a low cost even when the type (=spectral sensitivity) of the solar cell changes.

In the solar cell evaluation device and method in accordance with the present invention, a spectral sensitivity (a spectral-response) $P(\lambda)$ of a solar cell, which is a measurement object, is measured in advance. When the solar cell is evaluated, a spectral irradiance $L(\lambda)$ of illumination light is measured, generated power EL of the solar cell that is generated with the illumination light is measured, and the measured generated power EL of the solar cell is converted into generated power ES generated by the solar cell in the case of illumination with illumination light with a spectral irradiance $S(\lambda)$ based on the reference solar light. Therefore, in the solar cell evaluation device and measurement method in accordance with the present invention, the calibration is performed with software, and the calibration can be performed in a simple manner and at a low cost even when the solar cell type is changed.

The abovementioned and other objects, specific features, and merits of the present invention will become apparent from the following detailed description and appended drawings.

MODES FOR CARRYING OUT THE INVENTION

Figure 1:
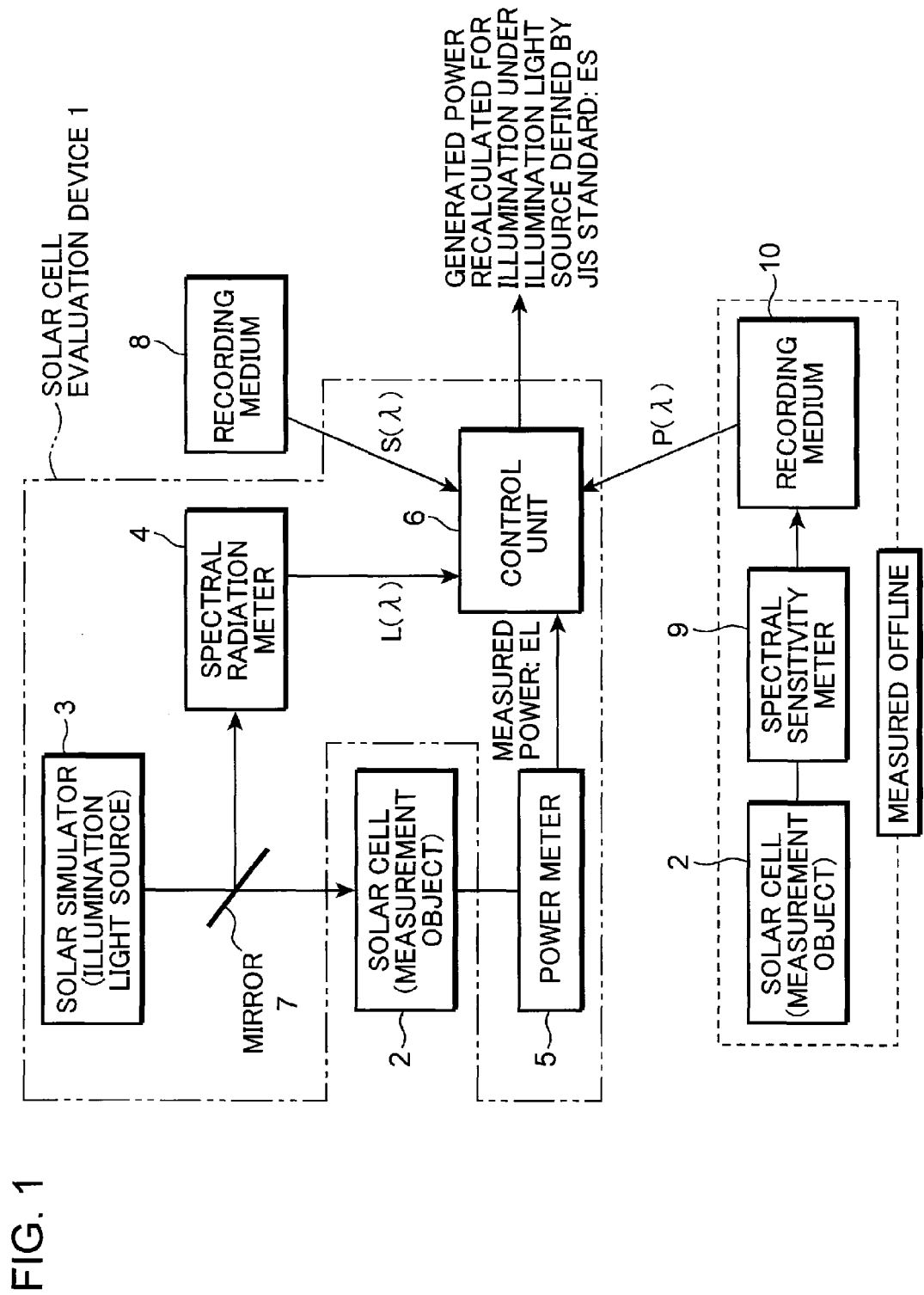
FIG. 1 is a block diagram illustrating the configuration of the solar cell evaluation device according to one embodiment of the present invention.

Embodiments of the present invention will be described below with reference to the appended drawings. In the drawings, like components are assigned with like reference numerals and the explanation thereof is omitted as appropriate.

Embodiment 1

FIG. 1 is a block diagram illustrating the configuration of a solar cell evaluation device 1 according to one embodiment of the present invention. The solar cell evaluation device 1 is constituted by the conventional solar simulator (illumination light source) 3 that generates light simulating reference solar light defined in the aforementioned JIS standard (C8912) and illuminates a solar cell 2 that is a measurement object, a spectral radiation meter 4 that can take in the illumination light generated by the solar simulator 3 and monitors the spectrum and irradiance thereof, a power meter 5 that measures generated power of the solar cell 2 generated under the illumination light from the solar simulator 3, and a control unit 6 as a calculation means. Thus, the important feature of the solar cell evaluation device 1 of the present embodiment is that the spectral irradiance $L(\lambda)$ of the solar simulator (illumination light source) 3 is not attempted to be matched by using hardware with a zero error with the spectral irradiance $S(\lambda)$ under an irradiance of 1000 W/m² of the reference solar light defined by the aforementioned JIS standard (C8912), as in the conventional device. Instead, the error and the fluctuation of light quantity of the solar simulator 3 are successively monitored by the spectral radiation meter 4 and the calibration is performed with software in the control unit 6. In some cases a single illumination light source is taken as a solar simulator and in other cases the entire system including the system for measuring the generated power of the solar cell is taken as the solar simulator. In the present embodiments, the former approach is followed.

Figure 6:
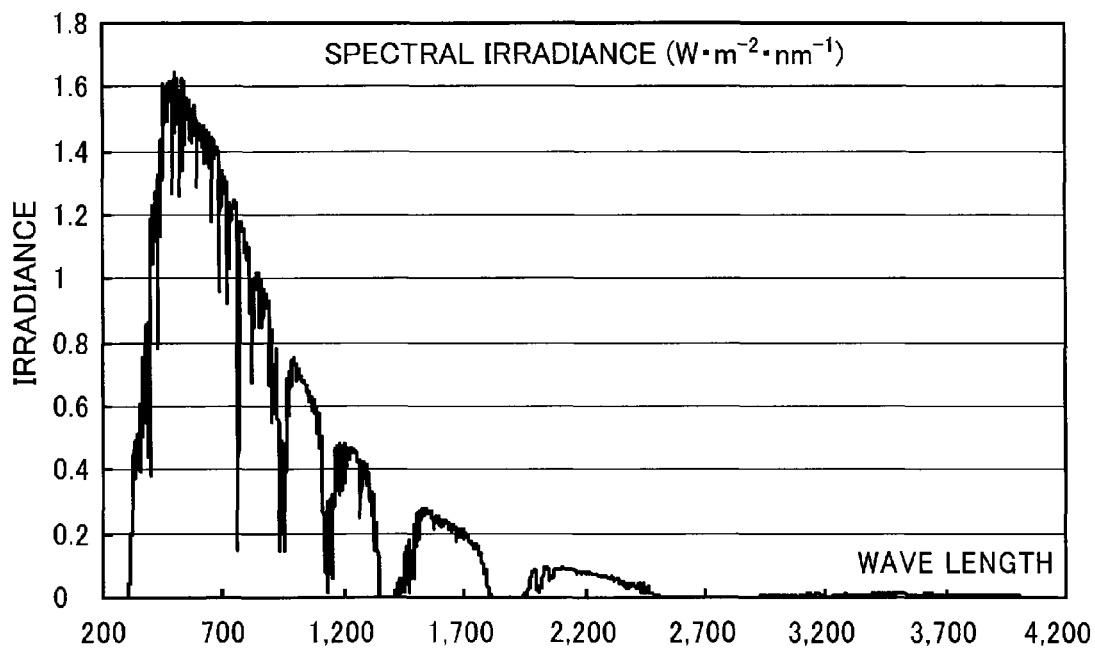
FIG. 6 is a graph illustrating the spectral irradiance obtained with the reference solar light.
Figure 7:
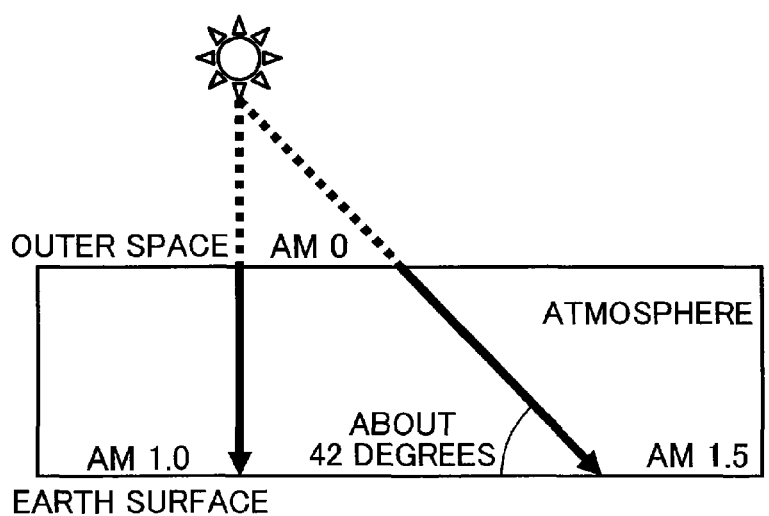
FIG. 7 illustrates the mechanism of difference in the spectral irradiance of solar light caused by difference in location.

Accordingly, a mirror 7 is introduced into the optical path from the solar simulator (illumination light source) 3 to the solar cell 2, part of the illumination light produced by the solar simulator 3 is reflected (for example, 99% are passed and 1% is reflected) by the mirror 7 and caused to fall on the spectral radiation meter 4, and the spectrum and irradiance thereof, that is, the spectral irradiance $L(\lambda)$ is monitored. Data on the spectral irradiance $L(\lambda)$ that are thus obtained are inputted in the control unit 6. The spectral radiation meter is of a type in which the spectral irradiance $L(\lambda)$ can be measured with a pitch of 1 nm, but a device of general use can be also employed. Further, in the control unit 6, data on the spectral irradiance $S(\lambda)$ that are obtained with the reference solar light and shown in FIG. 6 are also inputted by using a recording medium 8 or the like. The spectral sensitivity $P(\lambda)$ is measured in advance for the solar cell 2, which is the measurement object, with a spectral sensitivity meter 9, and the measurement result is inputted to the control unit 6 by means of a recording medium 10 or the like.

By using the data on $S(\lambda)$, $L(\lambda)$, and $P(\lambda)$ inputted in the above-described manner, the control unit 6 recalculates the power generated by the solar light 2 with the spectral sensitivity $P(\lambda)$ under the illumination light with the spectral irradiance $L(\lambda)$ from the solar simulator 3 into the power generated under the spectral irradiance $S(\lambda)$, that is, under the irradiance of 1000 W/m² of the reference solar light and outputs the recalculated generated power. The recalculation procedure is described below.

Thus, where the spectral sensitivity of the solar cell 2 that has been measured in advance is denoted by $P(\lambda)$, the spectral irradiance of the illumination light of the solar simulator 3 that has actually been measured by the spectral radiation meter 4 is denoted by $L(\lambda)$, and the spectral sensitivity of the reference solar light given as numerical data is denoted as $S(\lambda)$, as mentioned hereinabove, and a value based on a conversion coefficient of the solar cell 2 is denoted by k, the measurement result obtained with the power meter 5 is denoted by EL, and the power generated under the illumination light with the spectral irradiance $S(\lambda)$ produced by the reference solar light is denoted by ES, then the following relationships are valid.

$$EL = k \cdot \{\int L(\lambda) \cdot P(\lambda) d\lambda\}$$

$$ES = k \cdot \{\int S(\lambda) \cdot P(\lambda) d\lambda\}.$$

Therefore, $$k = EL / \{\int L(\lambda) \cdot P(\lambda) d\lambda\}.$$

As a result, $$ES = EL \cdot \{\int S(\lambda) \cdot P(\lambda) d\lambda\} / \{\int L(\lambda) \cdot P(\lambda) d\lambda\}.$$

As mentioned hereinabove, it is thus possible to determine the power generated under the irradiance of 1000 W/m² of the reference solar light. Further, spectral sensitivity (spectral sensitivity $P(\lambda)$) of solar cells is typically determined by the material used, but the generated power has a production spread caused by the spread in film thickness or the like, and the value k based on the conversion coefficient in the equation above changes. However, the value k is not included in the recalculation result of the generated power obtained under the reference solar light, and the effect of such a production spread can be eliminated.

Figure 2:
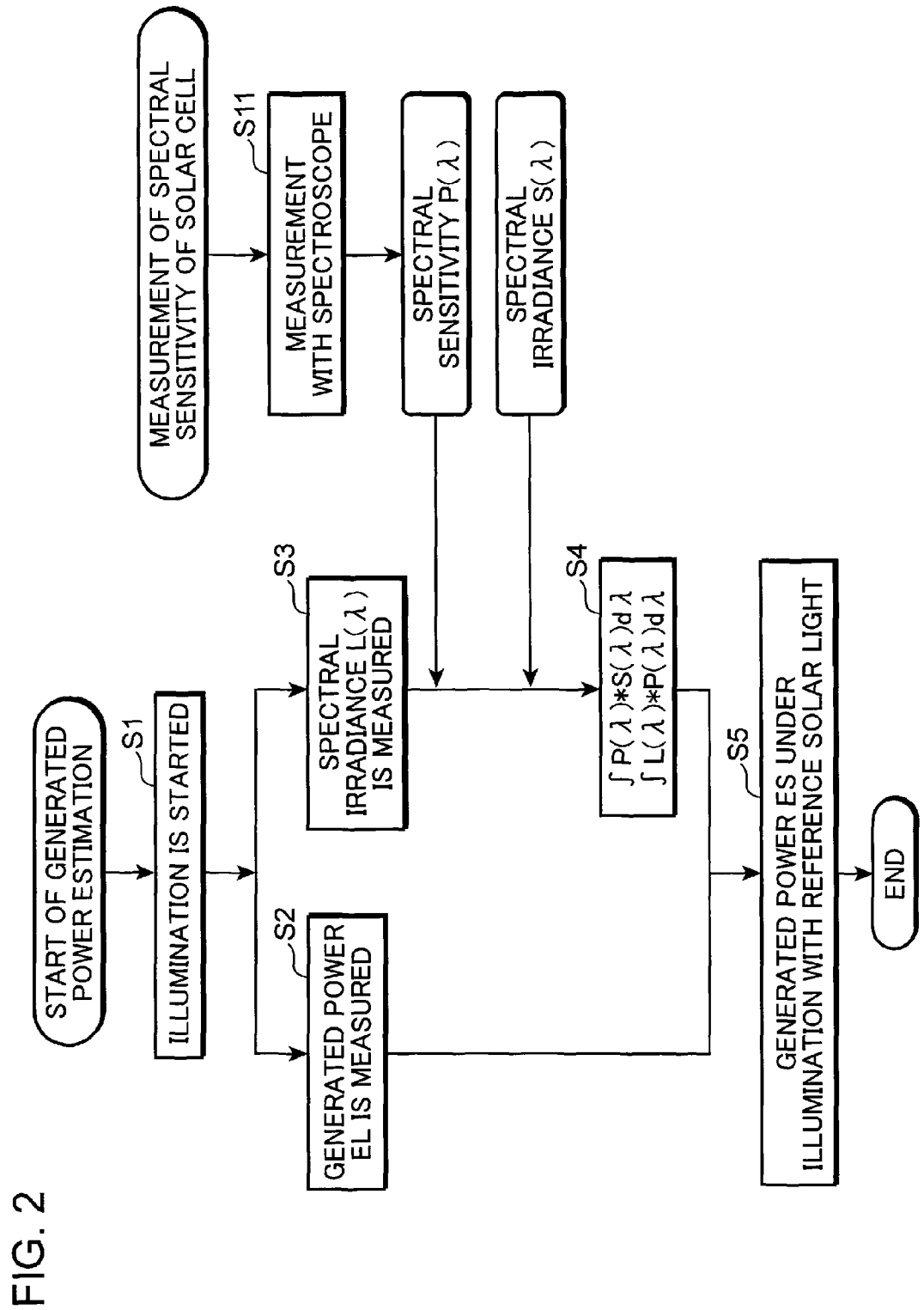
FIG. 2 is a flowchart for explaining the operation of estimating the generated power in the embodiment of the solar cell under the reference solar light.

FIG. 2 is a flowchart for explaining the operation of estimating the generated power under the above-described reference solar light. In step S1, the solar simulator (illumination light source) 3 is turned on and the illumination is started. In step S2, the generated power EL of the solar cell 2 is measured with the power meter. In parallel, in step S3, the spectral irradiance L(λ) of the illumination light of the solar simulator 3 is measured with the spectral radiation meter 4.

In step S11, the spectral sensitivity P(λ) of the solar cell 2 is measured by the spectral sensitivity meter 9 and the measurement result is inputted together with the spectral irradiance S(λ) of the reference solar light into the control unit 6. In step S4, the above-described calculation is performed with the spectral irradiance L(λ) of the illumination light, and in step S5, the power ES generated under the reference solar light is determined.

With such a configuration, it is not necessary to calibrate the solar simulator (illumination light source) 3 in advance by using the reference cell such as described in the related art, and the calibration (the aforementioned recalculation) can be performed in a simple manner from the actually measured value to a measurement value that is supposed to be under the reference solar light, even when the type (=spectral sensitivity) of the solar cell 2 is changed. Further, it is not necessary to match, with an unnecessarily high accuracy, the spectral irradiance L(λ) with the spectral irradiance S(λ) under the reference solar light in the solar simulator (illumination light source) 3, and the solar simulator (illumination light source) 3 can be reduced in cost.

Figure 3:
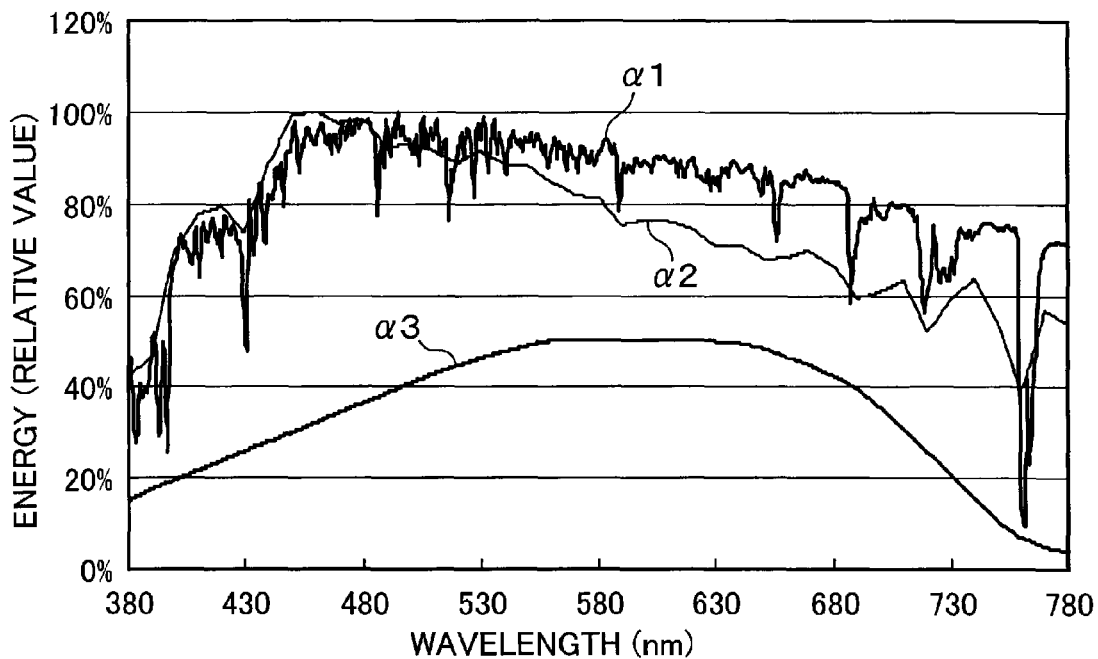
FIG. 3 is a graph illustrating the difference in the generated power under illumination of the solar cell with the reference solar light and D65 light source.

Further, by providing numerical data of a randomly selected light source, for example, a D65 light source, for the spectral irradiance S(λ), it is possible to calculate the generated power for the case in which the solar cell 2 is used in this randomly selected light source. FIG. 3 is a graph illustrating the difference in the generated power under illumination of the solar cell with the reference solar light and the D65 light source. The reference symbol a1 denotes a spectrum of the reference solar light shown in FIG. 6, and the reference symbol α2 denotes the spectrum of the D65 light source. When the spectral sensitivity P(λ) of a silicon solar cell is indicated by the reference symbol α, the following equations are valid:

$$EL = \int L(\lambda) \cdot P(\lambda) d\lambda = 110.$$

$$ES = \int S(\lambda) \cdot P(\lambda) d\lambda = 120.$$

The generated power in the case of illumination with the reference solar light can be estimated by multiplying the generated power obtained with the D65 light source by 120/110. In FIG. 3, the spectral irradiance of the solar simulator (illumination light source) on the long wavelength side is less than that of the reference solar light and therefore it is clear that the value to be used for multiplication is larger than 1.

Figure 4:
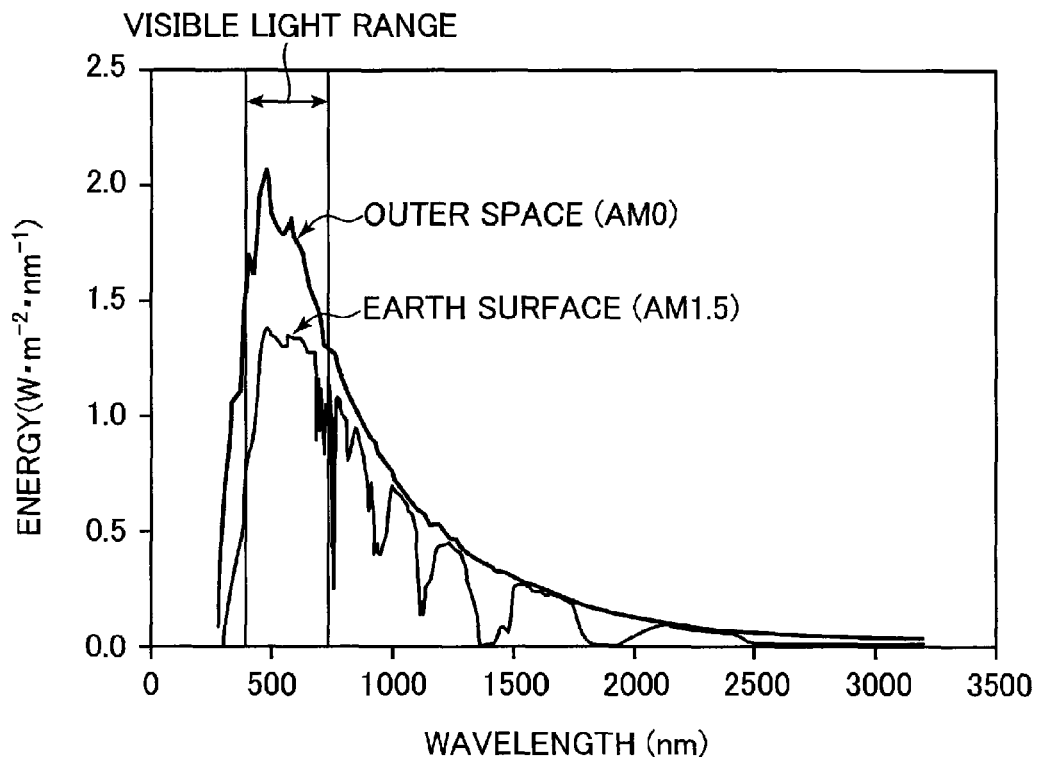
FIG. 4 is a graph illustrating the difference in spectral irradiance on the earth surface in a warm climate zone (AM1.5) and the outer space (AM0).

Likewise, the spectral irradiance S(λ) of the reference solar light is determined at the earth surface (AM1.5), but by changing the data of the spectral irradiance S(λ), the control unit 6 can also calculate the generated power for the outer space (AM0) or any region. Thus, although the measurement with the reference solar light is required in the JIS/IEC, the spectral irradiance of the solar light changes depending on the arrangement location of the solar cell 2. For this reason, in the conventional solar simulator, when the generated power is determined under a spectral irradiance different from that on the earth ground, the measurements should be conducted by using a solar simulator with the spectral irradiance matched with each region and time. By contrast, in the present embodiment, by changing the data on spectral irradiance S(λ) of the reference solar light, as described hereinabove, it is possible to obtain the effect equal to that obtained when the illumination light is freely changed. For example, the spectral irradiance at the earth surface (AM1.5) in a warm climate zone (AM1.5) and the spectral irradiance in the outer space (AM0) differ significantly from each other as shown in FIG. 4. In the solar cell evaluation device 1 according to the present embodiment, this issue can be addressed by software processing by merely changing the data on spectral irradiance S(λ) of the reference solar light.

Embodiment 2

Figure 5:
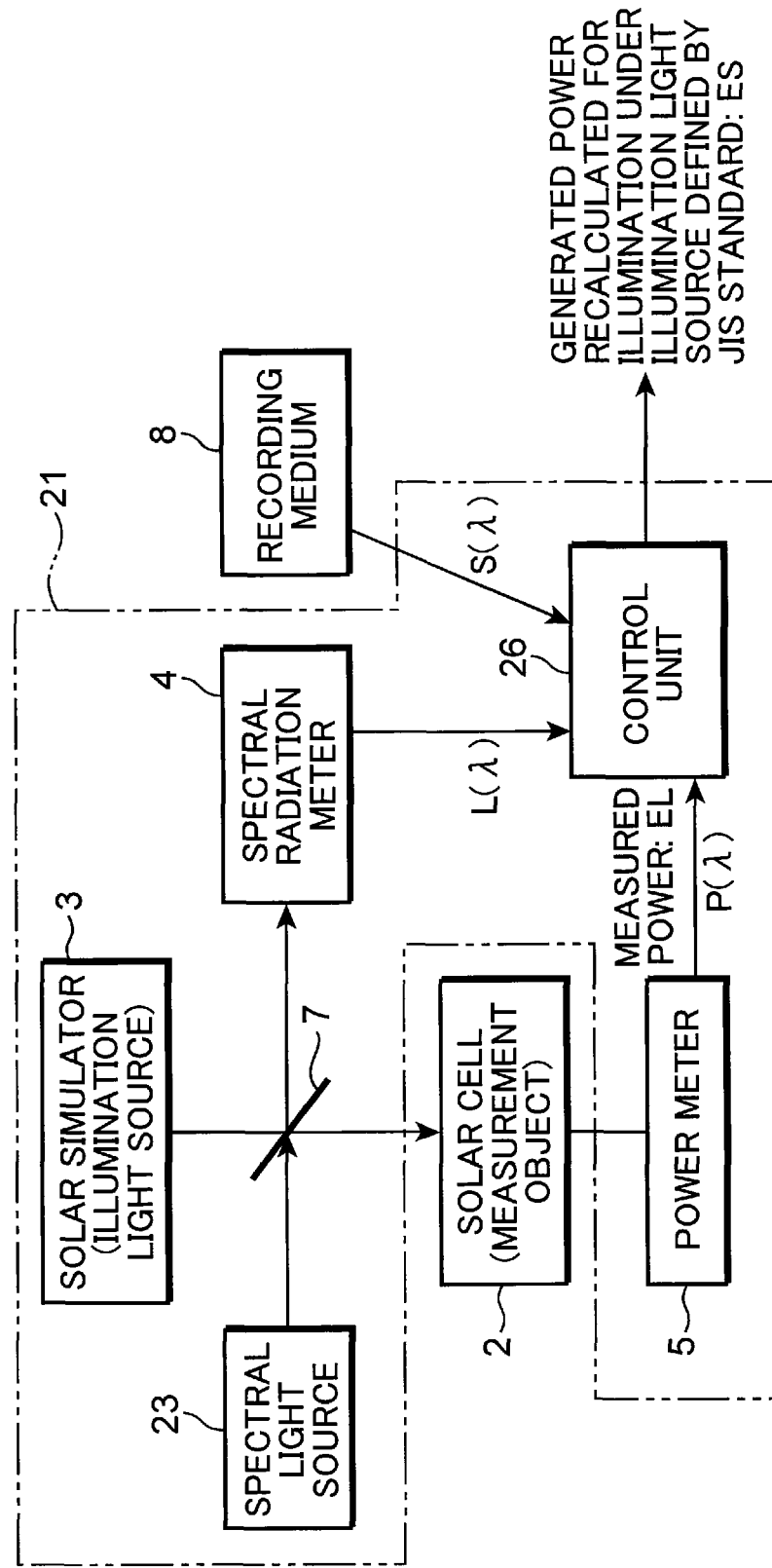
FIG. 5 is a block diagram illustrating the configuration of the solar cell evaluation device of another embodiment of the present invention.

FIG. 5 is a block diagram illustrating the configuration of a solar cell evaluation device 21 of another embodiment of the present invention. In the solar cell evaluation device 21, the components similar or corresponding to those of the aforementioned solar cell evaluation device 1 are assigned with same reference numerals and the explanation thereof is omitted. In the solar cell evaluation device 21, a spectral light source 23 capable of emitting bright line radiation is incorporated in the solar cell 2, which is the object of the measurement, a control unit 26 that is a calculation means takes in the measurement results of the power meter 5 obtained with the bright light radiation from the spectral light source 23 as the spectral sensitivity P(λ) of the solar cell 2.

Two methods for measuring the spectral sensitivity P(λ) of the solar cell 2 with the bright light radiation are defined in the JIS standard (C8915). With the first measurement method, monochromatic light illumination is performed (monochromatic light beams with a half width equal to or less than 5 nm, and the illumination is consecutively performed with light of each monochromatic beam with a wavelength pitch thereof being 25 nm), and the power generated by the solar cell 2 under such illumination is successively found. With the second measurement method the aforementioned monochromatic light illumination is performed, while conducting illumination with the reference solar light (white bias) from an illumination light source (solar simulator) 3 and the generated power of the solar cell 2 is found. Thus, with the second measurement method, the solar cell 2 is maintained in the operation state by the white bias.

Since the measurement results of the power meter 5 obtained with the bright line illumination are taken in as the spectral sensitivity P(λ) by the control unit 26, it is not necessary to measure in advance the spectral sensitivity P(λ) of the solar cell 2, as in the above-described solar cell evaluation device 1.

As indicated hereinabove, the present detailed description discloses configurations of various aspects. The main aspects among them will be described below.

The first aspect resides in a solar cell evaluation device including: an illumination unit that illuminates a solar cell that is a measurement object with light simulating predetermined reference solar light and serving as illumination light; a spectral irradiance measurement unit that measures a spectral irradiance L (λ) by monitoring a spectrum and an irradiance of the illumination light; a power measurement unit that measures generated power of the solar cell illuminated with the illumination light; and a calculation unit that converts generated power EL of the solar cell measured by the power measurement unit by illuminating the solar cell having a spectral sensitivity P(λ) that has been measured in advance with the illumination light into generated power ES generated by the solar cell in the case of illumination with illumination light with a spectral irradiance S(λ) based on the reference solar light.

Another aspects resides in a solar cell evaluation method for evaluating a solar cell, including: a step of acquiring a spectral sensitivity P(λ) of the solar cell; a step of measuring a spectral irradiance L (λ) from a spectrum and an irradiance of light simulating predetermined reference solar light and generated as illumination light; a step of illuminating the solar cell with the illumination light and measuring generated power EL of the solar cell; and a step of converting the obtained generated power EL into generated power ES generated by the solar cell in the case of illumination with illumination light with a spectral irradiance S(λ) based on the reference solar light from the spectral sensitivity P(λ) of the solar cell and the spectral irradiance L (λ) of the illumination light.

With the above-described configurations, the spectral irradiance L(λ) of the solar simulator (illumination light source) is not attempted to be matched by using hardware with a zero error with the spectral irradiance S(λ) under an irradiance of 1000 W/m² of the reference solar light defined by the JIS standard, as in the conventional device. Instead, the error and the fluctuation of light quantity of the solar simulator are successively monitored and the calibration is performed with software. Thus, the spectral sensitivity P(λ) of the solar cell is measured in advance, for example, with a spectral sensitivity meter that measures spectral sensitivity, the solar cell is illuminated with illumination light having the spectral irradiance L(λ), power generated by the solar cell is measured, and the measurement result is recalculated into the power generated under the spectral irradiance S(λ), that is, the irradiance of 1000 W/m² of the reference solar light.

Therefore, it is not necessary to calibrate the solar simulator (illumination light source) in advance by using the aforementioned reference cell, and the calibration can be performed in a simple manner from the actually measured value to a measurement value that is supposed to be under the reference solar light, even when the type (=spectral sensitivity) of the solar cell is changed. Further, it is not necessary to match, with an unnecessarily high accuracy, the spectral irradiance L(λ) with the spectral irradiance S(λ) under the reference solar light in the solar simulator (illumination light source), and the solar simulator (illumination light source) can be reduced in cost. Further, by providing numerical data of a randomly selected light source, for example, a D65 light source, for the spectral irradiance S(λ), it is possible to calculate the generated power for the case in which the solar cell is used in this randomly selected light source. Likewise, the spectral irradiance S(λ) of the reference solar light is determined at the earth surface (AM1.5), but the generated power for the outer space (AM0) or any region can be also calculated.

Further, in the JIS standard (C8910), the spectral irradiance L(λ), spectral sensitivity P(λ), and spectral irradiance S(λ) are represented by $\phi_m(\lambda)$, $\phi_S(\lambda)$, and Q(λ), respectively.

According to another aspect, in the above-described solar cell evaluation device, the calculation device converts the generated power EL of the solar cell into the generated power ES of the solar cell by using:

$$ES = EL \cdot \{\int S(\lambda) \cdot P(\lambda) d\lambda\} / \{\int L(\lambda) \cdot P(\lambda) d\lambda\}$$

With such a configuration, the power generated under an irradiance of 1000 W/m² of the reference solar light can be determined with the equation above. Further, spectral sensitivity (spectral sensitivity P(λ)) of solar cells is typically determined by the material used, but the generated power has a production spread caused by the spread in film thickness or the like, and the value based on the conversion coefficient k in the equation above changes. However, the conversion coefficient k is not included in the recalculation result of the generated power obtained under the reference solar light, and the effect of such a production spread can be eliminated.

According to another aspect, it is preferred that the above-described solar cell evaluation device further include a spectral light source capable of performing bright line illumination of the solar cell that is the measurement object, and the calculation unit take a measurement result obtained by measurements in the power measurement unit as the spectral sensitivity P(λ) of the solar cell by performing the bright light illumination of the solar cell by the spectral light source.

With such a configuration, a spectral light source is provided that is capable of performing bright line illumination of the solar cell that is the measurement object, the illumination is consecutively performed with light of each monochromatic beam with a wavelength pitch of 25 nm, the monochromatic light beams having a half width of equal to or less than 5 nm, and the measurement result of the generated power measured by the power measurement unit is thus taken in as the spectral sensitivity P(λ) of the solar cell by the calculation unit, thereby making it unnecessary to measure the spectral sensitivity P(λ) in advance. With the abovementioned bright line illumination, the solar cell may be maintained in the operation state by providing the illumination light (white light) from the solar simulator.

This application is based on the Japanese Patent Application No. 2008-295499 filed on Nov. 19, 2008, and the contents thereof are incorporated in the present application.

The present invention has been adequately and sufficiently explained above on the basis of embodiments thereof with reference to the appended drawings in order to describe the present invention, but it should be recognized that the above-described embodiments can be easily changed and/or modified by a person skilled in the art. Therefore, changes or modifications implemented by a person skilled in the art should be construed to be included in the scope of right of the invention, provided that the changes or modifications do not depart from the scope of right of the invention delineated in the claims.

Industrial Applicability

In accordance with the present invention, it is possible to provide a solar cell evaluation device and a solar cell evaluation method for evaluating a solar cell.

The invention claimed is:

1. A solar cell evaluation device comprising:
an illumination unit that illuminates a solar cell that is a measurement object;
a spectral irradiance measurement unit that measures a spectral irradiance L (λ) by monitoring a spectrum and an irradiance of illumination light radiated from the illumination unit;
a power measurement unit that measures a generated power EL of the solar cell illuminated with the illumination light; and
a calculation unit that performs a calibration with software when the measured spectral irradiance L (λ) is different from a spectral irradiance S(λ) of a predetermined reference solar light, even when spectral sensitivity of the solar cell is changed, by converting the generated power EL of the solar cell measured by the power measurement unit into a generated power ES generated by the solar cell in the case of illumination of the reference solar light with the spectral irradiance S(λ), such conversion is calculated using the measured spectral irradiance L(λ), a spectral sensitivity P(λ) of the solar cell that has been measured in advance and the spectral irradiance S(λ).

2. The solar cell evaluation device according to claim 1, wherein the calculation device converts the generated power EL of the solar cell into the generated power ES of the solar cell by using $ES = EL\{\int S(\lambda) \times P(\lambda) d\lambda\} / \{\int L(\lambda) P(\lambda) d\lambda\}$.

3. The solar cell evaluation device according to claim 1, further comprising a spectral light source capable of performing bright line illumination of the solar cell that is the measurement object, wherein the calculation unit takes a measurement result obtained by measurements in the power measurement unit as the spectral sensitivity P(λ) of the solar cell by performing the bright light illumination of the solar cell by the spectral light source.

4. The solar cell evaluation device according to claim 1, wherein the spectral sensitivity $P(\lambda)$ of the solar cell is measured in advance by a spectral sensitivity meter that measures a spectral sensitivity and the measured spectral sensitivity is set in the calculation unit.

5. A solar cell evaluation method comprising:
changing an existing first solar cell with a second solar cell that is of a different spectral sensitivity than the existing first solar cell;
acquiring a spectral sensitivity $P(\lambda)$ of the second solar cell;
measuring a spectral irradiance $L(\lambda)$ from a spectrum and an irradiance of light simulating predetermined reference solar light and generated as illumination light by an illumination unit;
illuminating the second solar cell with the illumination light and measuring generated power EL of the second solar cell; and
performing a calibration with software when the spectral irradiance $L(\lambda)$ is different from a spectral irradiance $S(\lambda)$ of a predetermined reference solar cell by converting the obtained generated power EL into generated power ES generated by the second solar cell in the case of illumination of the reference solar light with the spectral irradiance $S(\lambda)$, wherein the conversion is calculated using the acquired spectral sensitivity $P(\lambda)$, the measured spectral irradiance $L(\lambda)$ and the spectral irradiance $S(\lambda)$.

* * * * *